United States Patent [19]
Taniguchi et al.

[11] Patent Number: 5,723,256
[45] Date of Patent: Mar. 3, 1998

[54] COLOR IMAGE FORMING PROCESS THROUGH TRANSFER OF IMAGE PORTION TO RECEIVING MATERIAL, VIA CUSHION LAYER

[75] Inventors: Tetsuya Taniguchi; Kiyoshi Goto; Takeo Akiyama; Miyuki Hosoi, all of Hino; Tetsuya Masuda; Hideaki Mochizuki, both of Yokohama, all of Japan

[73] Assignee: Konica Corporation, Tokyo, Japan

[21] Appl. No.: 665,005

[22] Filed: May 15, 1996

Related U.S. Application Data

[62] Division of Ser. No. 331,793, Oct. 31, 1994, abandoned.

[30] Foreign Application Priority Data

Nov. 2, 1993 [JP] Japan ..... 5-297275

[51] Int. Cl.⁶ ..... G03F 7/40
[52] U.S. Cl. ..... 430/252; 430/258; 430/259
[58] Field of Search ..... 430/252, 259, 430/258

[56] References Cited

U.S. PATENT DOCUMENTS 4,489,154  12/1984  Taylor, Jr. ..... 430/253

FOREIGN PATENT DOCUMENTS

| 0 412 495 | 2/1991 | European Pat. Off. . |
| 0 451 736 | 10/1991 | European Pat. Off. . |
| 42 43 912 | 10/1993 | Germany . |
| 4-310954 | 11/1992 | Japan . |

OTHER PUBLICATIONS

Patent Abstracts Of Japan, vol. 017, No. 132 (P-1504) 18 Mar. 1993 of JP-A-04 310 954.

*Primary Examiner*—Christopher G. Young
*Attorney, Agent, or Firm*—Frishauf, Holtz, Goodman, Langer & Chick, P.C.

[57] ABSTRACT

Disclosed is a color image-formable material for forming and transferring a color image. The color image-formable material has a support, a cushion layer provided on the support and color light-sensitive layer containing a light-sensitive composition and a coloring agent provided on the cushion layer. It gives a transferred image by forming a color image portion by imagewise exposure and developing treatment and then transferring the color image portion alone to an image-receiving material. The cushion layer has a hardness of 40 to 85 and a thickness of 15 μm to 100 μm. A process for preparation of the color image-formable material is also disclosed.

7 Claims, No Drawings

COLOR IMAGE FORMING PROCESS THROUGH TRANSFER OF IMAGE PORTION TO RECEIVING MATERIAL, VIA CUSHION LAYER

This application is a Division of application Ser. No. 08/331,793, filed Oct. 31, 1994, now abandoned.

BACKGROUND OF THE INVENTION

This invention relates to a color image-formable material suitable for preparing a color proof for color correction in color printing and a process for preparing the same, particularly to a color image-formable material by which transfer to various image-receiving materials can be effected irrespectively of paper quality and the kind of image-receiving materials and a process for preparing the same.

It has been well known in this field of the art that a color sheet (also called a color proof) for color correction is used for the purpose of saving labor and time for proof printing which is carried out as a previous step of final printing in multicolor printing.

As a method of forming a multicolor transferred image by using a color sheet for color correction, there may be mentioned, for example, a direct transfer method in which a color image is directly transferred to and laminated on a final image-receiving paper described in Japanese Provisional Patent Publication No. 41830/1972, an indirect transfer method in which a color image is temporarily transferred to a temporary (image-receiving) sheet described in Japanese Provisional Patent Publications No. 97140/1984 and No. 189535/1986 and a method of repeating steps of transferring a color light-sensitive layer to an image-receiving paper and then forming an image described in Japanese Provisional Patent Publication No. 50127/1981.

In all of the methods described above, the surface of an image-receiving material on which an image is formed is covered with an organic polymer layer so that gloss of the surface of the resulting image is too high, whereby there is a problem of giving an impression different from quality of an image obtained by final printing. Particularly in the method of Japanese Provisional Patent Publication No. 189535/1986, a non-image portion is covered with an organic polymer layer (a polymer layer), whereby there is a problem that inherent gloss and feel of a material cannot be obtained.

In order to solve the above problems, there has been proposed a method in which only a color image is transferred to and laminated on an image-receiving material to obtain a multicolor image (Japanese Provisional Patent Publication No. 48248/1991). In this method, an image-receiving material is not covered with an organic polymer layer so that in principle, it is possible to obtain an image extremely approximate to quality of an image obtained by final printing. The present inventors have found that in a color image-formable material used in the method of transferring only an image portion, only an image is transferred from a heat-softening layer (a cushion layer) to an image-receiving material at the time of heat lamination so that there is a problem that complete transfer is difficult depending on the kind of an image-receiving material, particularly transfer property to a matted paper, a cardboard or the like having poor paper quality and a rough surface is impaired.

SUMMARY OF THE INVENTION

An object of the present invention is to provide a color image-formable material which can solve the above problems of the prior art and can give a color proof more approximate to a print even when an image-receiving material having poor paper quality and a rough surface is used and a process for preparing the same.

The above object of the present invention can be accomplished by the following present inventions 1 to 5:

1. A color image-formable material which comprises a support, a cushion layer provided on the support and a color light-sensitive layer containing a light-sensitive composition and a coloring agent provided on the cushion layer and gives a transferred image by forming a color image portion by imagewise exposure and developing treatment and then transferring the color image portion alone to an image-receiving material, wherein the cushion layer has a hardness of 40 to 85 and a thickness of 15 μm to 100 μm.

2. A color image-formable material which comprises a support, a cushion layer provided on the support and a color light-sensitive layer containing a light-sensitive composition and a coloring agent provided on the cushion layer and gives a transferred image by forming a color image portion by imagewise exposure and developing treatment and then transferring the color image portion alone to an image-receiving material, wherein the peeling strength of the cushion layer and the support is 150 gf/inch or more.

3. A process for preparing a color image-formable material which comprises a support, a cushion layer provided on the support and a color light-sensitive layer containing a light-sensitive composition and a coloring agent provided on the cushion layer, wherein the cushion layer has a hardness of 40 to 85 and a thickness of 15 μm to 100 μm,
wherein the process comprises, after providing the cushion layer, laminating a cover sheet on the cushion layer; then peeling the cover sheet and providing the color light-sensitive layer by coating on the peeled surface.

4. The process for preparing a color image-formable material of the present invention 3 wherein the cover sheet is subjected to antistatic treatment.

5. A color image-formable material which comprises a support, a cushion layer provided on the support and a color light-sensitive layer containing a light-sensitive composition and a coloring agent provided on the cushion layer and gives a transferred image by forming a color image portion by imagewise exposure and developing treatment and then transferring the color image portion alone to an image-receiving material, wherein the material used in the cushion layer is a natural rubber or a synthetic rubber.

As a method used for a color proof for color correction in color printing, there have been known a method described in Japanese Provisional Patent Publication No. 48248/1991 and a method described in Japanese Provisional Patent Publication No. 189535/1986. As to the method of Japanese Provisional Patent Publication No. 48248/1991, the present inventors have found that there is a problem that complete transfer is difficult depending on the kind of an image-receiving material, particularly transfer property to a matted paper, a cardboard or the like having poor paper quality and a rough surface is impaired. In the method of Japanese Provisional Patent Publication No. 189535/1986, a non-image portion is covered with a polymer layer, whereby there is a problem that inherent gloss and feel of a material cannot be obtained. These problems can be solved by the present inventions 1 to 5.

More specifically, (1) transfer can be effected irrespective of paper quality and an image-receiving material because transfer easily adjusted to surface roughness of an image-receiving material can be effected easily by the structure of a cushion layer in an image-formable method in which only an image portion is transferred. Therefore, (2) transfer can be effected more quickly under higher pressure to improve operatability, (3) transfer can be effected in a shorter time, whereby prevention of positional displacement can be expected, and further (4) preparation procedure becomes easy (after a support film is wound up, a subsequent procedure is carried out so that the film can be inspected in the middle of production). That is, a plastic film is temporarily laminated on a cushion layer and a color light-sensitive layer is coated while peeling the laminated film. In this preparation process, (5) trouble of sparks caused by static charge (when static marks appear, transfer is failed) can be prevented by subjecting the laminated film to antistatic treatment.

DESCRIPTION OF THE PREFERRED EMBODIMENTS

In the following, the present invention is explained in detail.

In the present invention 1, the cushion layer has a hardness of 40 to 85, preferably 40 to 80. A means for obtaining such hardness of the cushion layer is not limited and there may be used, for example, the means of the present invention 5. As the lamination method of the present invention 3, there may be used various lamination methods described below.

Operatability such as a rate of transfer is improved by the present invention 1, and operatability is further improved by controlling peeling of the support and the cushion layer according to the present invention 2.

The color image-formable material of the present invention may have a protective layer on the color light-sensitive layer or may have other layer(s) (or sheet(s)).

In the following, the present invention is further explained in detail.

The color light-sensitive layer referred to in the present specification means a layer constitution wherein a light-sensitive material and a coloring agent are contained in one layer or a layer constitution wherein a layer containing a light-sensitive material and a layer containing a coloring agent are provided separately.

As the light-sensitive composition to be used in the color light-sensitive layer of the present invention, a known positive type light-sensitive composition or negative type light-sensitive composition may be used. As the positive type light-sensitive composition, a light-sensitive composition comprising an o-quinonediazide compound is preferably used. As the o-quinonediazide compound, any o-quinonediazide compound may be used so long as it can function as a light-sensitive agent.

As the o-quinonediazide compound, there may be suitably used, for example, a compound obtained by condensing 1,2-benzoquinonediazide-4-sulfonyl chloride, 1,2-naphthoquinonediazide-4-sulfonyl chloride, 1,2-naphthoquinonediazide-5-sulfonyl chloride or 1,2-naphthoquinonediazide-6-sulfonyl chloride with a compound having a hydroxyl group and/or an amino group. Preferred are a compound having a sulfonyl chloride group at the 4-position and a compound obtained by condensation with 1,2-naphthoquinonediazide-4-sulfonyl chloride.

As the compound having a hydroxyl group, there may be mentioned, for example, trihydroxybenzophenone, dihydroxyanthraquinone, bisphenol A, a phenol novolak resin, a resorcin benzaldehyde condensed resin and a pyrogallol acetone condensed resin. As the compound having an amino group, there may be mentioned, for example, aniline, p-aminodiphenylamine, p-aminobenzophenone, 4,4'-diaminodiphenylamine and 4,4'-diaminobenzophenone.

In addition to the above-mentioned, the o-quinonediazide compound is further described in J. Kosar, "Light-sensitive System" (published by John Willy & Sons Co. (New York) in 1965) and Nagamatsu and Inui, "Light-sensitive Polymer" (published by Kodansha (Japan) in 1977).

As the negative type light-sensitive composition, a photopolymerization type light-sensitive composition is preferred. As a photopolymerizable compound to be used in the composition, there may be used any photopolymerizable compound which has been generally used. For example, at least one compound optionally selected from the compound group consisting of acrylic acid, methacrylic acid, an acrylic acid ester and a methacrylic acid ester may be used. There may be mentioned, for example, ethylene glycol diacrylate, glycerin triacrylate, polyacrylate, ethylene glycol dimethacrylate, 1,3-propanediol dimethacrylate, 1,2,4-butanetriol trimethacrylate, polyethylene glycol dimethacrylate, trimethylolethane triacrylate, pentaerythritol dimethacrylate, pentaerythritol trimethacrylate, pentaerythritol tetramethacrylate, pentaerythritol diacrylate, pentaerythritol triacrylate, pentaerythritol tetraacrylate, dipentaerythritol polyacrylate, 1,3-propanediol diacrylate, 1,5-pentanediol dimethacrylate and polyethylene glycol bisacrylate or bismethacrylate, but the present invention is not limited thereby.

In the negative type light-sensitive composition, a photopolymerization initiator may be contained. Any photopolymerizaion initiator may be used, but a photopolymerization initiator which absorbs less light at a visible portion is preferred. As an example of such a photopolymerization initiator, there may be mentioned the following compounds, but the present invention is not limited thereby. The compounds are an aromatic ketone such as benzophenone, Michler's ketone (4',4'-bis(dimethylamino)benzophenone), 4,4'-bis(diethylamino)benzophenone, 4-methoxy-4'-dimethylaminobenzophenone, 2-ethylanthraquinone, phenanthraquinone and other aromatic ketones;

a benzoin ether such as benzoin, benzoin methyl ether, benzoin ethyl ether and benzoin phenyl ether;

a benzoin such as methyl benzoin, ethyl benzoin and other benzoins; and an imidazole dimer such as a 2-(o-chlorophenyl)-4,5-diphenylimidazole dimer, a 2-(o-chlorophenyl)-4,5-(m-methoxyphenyl)imidazole dimer, a 2-(o-fluorophenyl)-4,5-diphenylimidazole dimer, a 2-(o-methoxyphenyl)-4,5-diphenylimidazole dimer, a 2-(p-methoxyphenyl)-4,5-diphenylimidazole dimer, a 2,4-di(p-methoxyphenyl)-5-phenylimidazole dimer, a 2-(2,4-dimethoxyphenyl)-4,5-diphenylimidazole dimer, a 2-(p-methylmercaptophenyl)-4,5-diphenylimidazole dimer and a 2,4,5-triacrylimidazole dimer which is similar to dimers described in U.S. Pat. No. 3,479,185, U.K. Patent No. 1,047,569 and U.S. Pat. No. 3,784,557.

As other photopolymerizable compound, a thioxanthone such as 2,4-diethylthioxanthone may be used. In this case, as a photopolymerization accelerator, a known compound, for example, isoamyl p-dimethylaminobenzoate, ethyl p-dimethylaminobenzoate, N-methyldiethanolamine or bis-diethylaminobenzophenone may be used.

The light-sensitive composition of the present invention may contain a known polymeric compound and a synthetic resin. For example, it is preferred that a polymeric compound having a vinyl carboxylate polymer unit represented by the following formula in its molecular structure is contained.

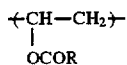

wherein R represents an alkyl group or a substituted alkyl group.

Any polymeric compound having a structure as described above may be used, but as a vinyl carboxylate monomer for constituting the polymer unit represented by the above formula, the following exemplary monomers are preferred. Compound names and chemical formulae thereof are shown below.

| | | |
|---|---|---|
| 1. | Vinyl acetate | $CH_3COOCH=CH_2$ |
| 2. | Vinyl propionate | $CH_3CH_2COOCH=CH_2$ |
| 3. | Vinyl butyrate | $CH_3(CH_2)_2COOCH=CH_2$ |
| 4. | Vinyl pivalate | $(CH_3)_3CCOOCH=CH_2$ |
| 5. | Vinyl caproate | $CH_3(CH_2)_4COOCH=CH_2$ |
| 6. | Vinyl caprylate | $CH_3(CH_2)_6COOCH=CH_2$ |
| 7. | Vinyl caprinate | $CH_3(CH_2)_8COOCH=CH_2$ |
| 8. | Vinyl laurate | $CH_3(CH_2)_{10}COOCH=CH_2$ |
| 9. | Vinyl myristate | $CH_3(CH_2)_{12}COOCH=CH_2$ |
| 10. | Vinyl palmitate | $CH_3(CH_2)_{14}COOCH=CH_2$ |
| 11. | Vinyl stearate | $CH_3(CH_2)_{16}COOCH=CH_2$ |
| 12. | Vinyl versatate | $R^1-\underset{R^2}{\underset{|}{\overset{CH_3}{\overset{|}{C}}}}-COOCH=CH_2$ | wherein $R^1$ and $R^2$ each represent an alkyl group and the total carbon number of $R^1$ and $R^2$ is 7, i.e., $R^1 30 R^2 = C_7H_{16}$.

The polymeric compound may be either a polymer obtained by polymerizing one vinyl carboxylate, a copolymer obtained by copolymerizing two kinds of vinyl carboxylates or a copolymer of vinyl carboxylate and other monomer which can be copolymerized with vinyl carboxylate with any component ratio.

As a monomer unit which can be used in combination with the polymer unit represented by the above formula, there may be mentioned an ethylenic unsaturated olefin such as ethylene, propylene, isobutylene, butadiene and isoprene;

a styrene such as styrene, α-methylstyrene, p-methylstyrene and p-chlorostyrene;

an acrylic acid such as acrylic acid and methacrylic acid;

an unsaturated aliphatic dicarboxylic acid such as itaconic acid, maleic acid and maleic anhydride;

a diester of an unsaturated dicarboxylic acid such as diethyl maleate, dibutyl maleate, di-2-ethylhexyl maleate, dibutyl fumarate and di-2-ethylhexyl fumarate;

an α-methylene aliphatic monocarboxylate such as methyl acrylate, ethyl acrylate, n-butyl acrylate, isobutyl acrylate, phenyl acrylate, methyl α-chloroacrylate, methyl methacrylate and ethyl ethacrylate;

a nitrile such as acrylonitrile and methacrylonitrile;

an amide such as acrylamide;

an anilide such as acrylanilide, p-chloroacrylanilide, m-nitroacrylanilide and m-methoxyacrylanilide;

a vinyl ether such as methyl vinyl ether, ethyl vinyl ether, isobutyl vinyl ether and β-chloroethyl vinyl ether;

vinyl chloride, vinylidene chloride and vinylidene cyanide;

an ethylene derivative such as 1-methyl-1-methoxyethylene, 1,1-dimethoxyethylene, 1,2-dimethoxyethylene, 1,1-dimethoxycarbonylethylene and 1-methyl-1-nitroethylene; and a vinyl type monomer such as a N-vinyl compound (e.g., N-vinylpyrrole, N-vinylcarbazole, N-vinylindole, N-vinylpyrrolidene and N-vinylpyrrolidone). These monomer units exist in the polymeric compound in a structure of a cleaved double bond.

As the polymeric compound to be used in the present invention, polymeric compounds having a vinyl acetate polymer unit in a molecular structure are particularly preferred. Among them, preferred are those having 40 to 95% by weight of a vinyl acetate polymer unit, a number average molecular weight (MN) of 1,000 to 60,000 and a weight average molecular weight (MW) of 500 to 150,000.

More preferred is a polymeric compound having a vinyl acetate polymer unit (particularly having 40 to 95% by weight of said unit) and a polymer unit of vinyl carboxylate having a chain longer than that of vinyl acetate, particularly having a number average molecular weight (MN) of 2,000 to 60,000 and a weight average molecular weight (MW) of 10,000 to 150,000.

In this case, a monomer which is copolymerized with vinyl acetate to constitute the polymeric compound having a vinyl acetate polymer unit may be any monomer so long as it is copolymerizable. The monomer can be optionally selected from, for example, the above exemplary monomers.

In the following, copolymers which can be used as the polymeric compound in the present invention are enumerated by showing monomer components thereof. As a matter of course, the present invention is not limited thereby.

1. Vinyl acetate-ethylene
2. Vinyl acetate-styrene
3. Vinyl acetate-crotonic acid
4. Vinyl acetate-maleic acid
5. Vinyl acetate-2-ethylhexyl acrylate
6. Vinyl acetate-di-2-ethylhexyl maleate
7. Vinyl acetate-methyl vinyl ether
8. Vinyl acetate-vinyl chloride
9. Vinyl acetate-N-vinylpyrrolidone
10. Vinyl acetate-vinyl propionate
11. Vinyl acetate-vinyl pivalate
12. Vinyl acetate-vinyl versatate
13. Vinyl acetate-vinyl laurate
14. Vinyl acetate-vinyl stearate
15. Vinyl acetate-vinyl versatate-ethylene
16. Vinyl acetate-vinyl versatate-2-ethylhexyl acrylate
17. Vinyl acetate-vinyl versatate-vinyl laurate
18. Vinyl acetate-vinyl versatate-crotonic acid
19. Vinyl propionate-vinyl versatate
20. Vinyl propionate-vinyl versatate-crotonic acid
21. Pivalic acid-vinyl stearate-maleic acid By using the light-sensitive composition of the present invention, an image-formable material can be prepared. For example, a color image-formable material which is used as a color proof can be prepared.

In this case, a color light-sensitive layer of the color image-formable material is removed imagewisely by development after imagewise exposure to form a color image portion.

To the color light-sensitive layer, a dye and/or a pigment is/are added as a coloring agent. Particularly when the color image-formable material is used for color correction, pigments and/or dyes having color tones corresponding to ordinary colors required for color correction, i.e., yellow, magenta, cyan and black are required, and also other metallic powders, a white pigment and a fluorescent pigment are used. When the present invention is applied to a color proof, the following various pigments and dyes which have been conventionally known in this field of the art may be used.

| | |
|---|---|
| Victoria Pure Blue | (C.I 42595) |
| Auramine | (C.I 41000) |
| Carotene Brilliant Flavin | (C.I Basic 13) |
| Rhodamine 6GCP | (C.I 45160) |
| Rhodamine B | (C.I 45170) |
| Safranine OK 70:100 | (C.I 50240) |
| Erioglaucine X | (C.I 42080) |
| Fast Black HB | (C.I 26150) |
| No. 1201 Lionol Yellow | (C.I 21090) |
| Lionol Yellow GRO | (C.I 21090) |
| Symlar Fast Yellow 8GF | (C.I 21105) |
| Benzidine Yellow 4T-564D | (C.I 21095) |
| Symlar Fast Red 4015 | (C.I 12355) |
| Lionol Red 7B4401 | (C.I 15830) |
| Fastgen Blue TGR-L | (C.I 74160) |
| Lionol Blue SM | (C.I 26150) |

(C.I means a color index.)
Mitsubishi Carbon Black MA-100 (tradename, produced by Mitsubishi Kasei Corporation)
Mitsubishi Carbon Black #30, #40 and #50 (trade names, produced by Mitsubishi Kasei Corporation)

When the coloring agent is used, the ratio of the coloring agent to components other than the coloring agent in the color light-sensitive layer can be determined according to a method known to those skilled in the art in consideration of target optical density and removing property to a developing solution of the color light-sensitive layer. For example, in the case of a dye, the ratio is preferably 5% to 75% in terms of weight and in the case of a pigment, the ratio is preferably 5% to 90% in terms of weight.

The film thickness of the color light-sensitive layer can be determined according to a method known to those skilled in the art in consideration of target optical density, the kind of the coloring agent (dye, pigment or carbon black) used in the color light-sensitive layer and a content thereof. If the thickness is within a permissive range, when the thickness is as thin as possible, resolving power is heightened and image quality becomes good. Therefore, the film thickness is generally preferably in the range of 0.1 $g/m^2$ to 5 $g/m^2$.

When the present invention is practiced, a plasticizer and a coatability improving agent may be further added to the light-sensitive composition, if necessary.

As the plasticizer, there may be mentioned various low molecular weight compounds such as phthalic acid esters, triphenylphosphates and maleic acid esters. As the coatability improving agent, there may be mentioned a surfactant such as a fluorine type surfactant and a nonionic surfactant.

When a color image-formable material is prepared by using the light-sensitive composition of the present invention, the color light-sensitive layer may be divided into two layers of a color layer comprising a coloring agent and a binder and a light-sensitive layer comprising the light-sensitive composition. In this case, either of the two layers may be provided at a support side.

When an image-formable material is prepared by using the light-sensitive composition of the present invention, any support may be used, but a transparent support is preferably used. As the transparent support, a polyester film, particularly a biaxially stretched polyethylene terephthalate film is preferred in the point of dimensional stability to water and heat. Also, an acetate film, a polyvinyl chloride film, a polyethylene film, a polypropylene film and a polyethylene film may be used.

As a protective layer which is used, if necessary, any known protective layer may be used, but it is preferred to select its gas permeability depending on the kind of the light-sensitive composition to be used. That is, when the light-sensitive composition which generates gas at the time of exposure of o-quinonediazide and others is used, it is preferred to provide a protective layer having high gas permeability, and when the photopolymerization type light-sensitive composition is used, it is preferred to provide a protective layer having low gas permeability. Further preferred is a protective layer which is dissolved in a developing solution during development, particularly a protective layer comprising a water-soluble polymer such as polyvinyl alcohol and cellulose with a dry film thickness of about 0.01 to 5 μm, particularly about 0.03 to 1 μm.

The image-formable material of the present invention can be used for transferring an image to an image-receiving material. For the purpose of effecting transfer to an image-receiving material with good efficiency, that is, for the purpose of heightening image transfer property, the cushion layer of the present invention is provided so that the surface of the support becomes a cushion as described below.

The image-formable method using the image-formable material of the present invention is to provide a transferred image by exposing and developing the image-formable material of the present invention to form an image portion and transferring at least image portion formed to an image-receiving material (e.g., printing paper).

When the image-formable method using the image-formable material of the present invention is embodied as, for example, a method of forming a multicolor image, one basic method is described below.

After a first color image is formed on a first color image-formable material, at least the first color image is transferred to an image-receiving material and a support is peeled off. After a second color image is formed on a second color image-formable material, the second color image is transferred on the first color image while registration of the second color register mark image formed thereby with the first color register mark image on the image-receiving material is conducted and a support is peeled off to obtain an image on which two colors are adjusted. In the same manner, a third color image and a fourth color image are transferred to the image-receiving material to obtain a multicolor image. Further, depending on the case, this multicolor image may be transferred indirectly to other image-receiving material to obtain a multicolor image. In the method described above, the cushion layer is peeled off with the support.

This kind of method is disclosed in Japanese Provisional Patent Publications No. 41830/1972, No. 97140/1984 and No. 28649/1985 and U.S. Pat. No. 3,775,113.

The image-formable material of the present invention is generally subjected to imagewise exposure through a color separation mask and then development to form an image. Here, only an image portion of the image obtained on a support is directly transferred to and laminated on an image-receiving material. That is, substantially only a color image layer forming the image is transferred and laminated. In this case, for the purposes of effecting transfer to the image-receiving material with good efficiency and facilitating peeling of the support after transfer of the image, the cushion layer of the present invention is provided on the support.

The thickness of the cushion layer is preferably 15 μm to 100 μm, preferably 20 μm to 50 μm.

As a representative cushion material to be used in the cushion layer, preferably those having the Vicat softening point of 30° to 100° C., more preferably 40° to 70° C. may be used. More specifically, there may be mentioned a natural rubber and the following synthetic rubbers: a thermoplastic rubber KRATON G (G1652, G1650 and others) (trade name, produced by Shell Chemical Co.), a thermoplastic rubber Cariflex TR (TR11184, TR1150, TR4122 and others) (trade name, Shell Chemical Co.), an ethylene-ethyl acrylate copolymer resin EVAFLEX-EEA (trade name, produced by Mitsui Du Pont Polychemical Co.), a polybutadiene type rubber, a styrene-butadiene copolymer, an acrylonitrile-butadiene copolymer, a polyisoprene type rubber resin, a styrene-isoprene copolymer, an acrylate copolymer and a polyurethane type co-condensed rubber.

Also, the cushion layer may be provided on the surface portion (upper portion) of the support by introducing a foaming agent into the surface of the support and effecting foaming by heating or irradiation of light to impart cushion property to said surface.

The method for preparing the cushion layer is not limited and the cushion layer is generally prepared by a coating process. For the purpose of heightening adhesiveness, it is effective to provide an anchor layer. As an anchoring agent, there may be mentioned a vinyl acetate type polymer, a polyethylene type polymer, a polyester type polymer, a polyurethane type polymer and a polyvinyl alkyl ether polymer. It is also effective to add an isocyanate compound or an epoxy compound as a crosslinking agent depending on the necessity.

In addition to the above cushion materials, other resin may be blended in the cushion layer within the range which does not impair the effect of the present invention. As a resin to be blended, a resin having a softening point of −30° C. to 150° C. is preferred. The softening point herein mentioned is a Vicat softening point or a value shown by the ring and ball method. In the present invention, as a specific preferred resin, there may be mentioned the following resins: a polyolefin such as polyethylene and polypropylene; an ethylene copolymer such as a copolymer of ethylene and vinyl acetate, ethylene and an acrylic acid ester or ethylene and acrylic acid; polyvinyl chloride; a vinyl chloride copolymer such as a copolymer of vinyl chloride and vinyl acetate; polyvinylidene chloride; a vinylidene chloride copolymer; polystyrene; a styrene copolymer such as a copolymer of styrene and maleic anhydride; polyacrylate; a polyester resin; a polyurethane resin; an acrylate copolymer such as a copolymer of acrylate and vinyl acetate; polymethacrylate; a methacrylate copolymer such as a copolymer of methyl methacrylate and vinyl acetate or methyl methacrylate and acrylic acid; polyvinyl acetate; a vinyl acetate copolymer; a vinyl butyral resin; a polyamide resin such as nylon, copolymer nylon and N-alkoxymethylated nylon; a petroleum resin; a chlorinated rubber; polyethylene glycol; a cellulose derivative; cellulose acetate phthalate; cellulose acetate succinate; shellac; and a wax. Among these, particularly preferred are a polyolefin such as polyethylene and polypropylene; an ethylene copolymer such as a copolymer of ethylene and vinyl acetate, ethylene and an acrylic acid ester or ethylene and acrylic acid; polyvinyl acetate; and a vinyl acetate copolymer.

The peeling strength of the cushion layer and the support of the present invention is 150 gf/inch or more, preferably 400 gf/inch or more. The peeling strength can be measured according to the method described in JIS K 7215.

Hardness is measured by using a Shore hardness tester. The Shore hardness tester is one kind of Shore scleroscope hardness testers and there are three kinds of C type, SS type and D type testers. Here, hardness is measured by the D type tester which has been used widely in Japan. The C type tester is a prototype of the SS type and D type testers. In the C type tester, when a diamond hammer is fallen on the surface of hardened steel having a high carbon content from a height of 10 inch, it is bounded with a height of 6.5 inch. Its scale is determined by defining the bounding height as 100, dividing the height equally and defining 0.065 inch as 1. Falling and sucking-up of the hammer are operated by a rubber ball, and the hammer moves up and down in a glass tube of which a section is round. In the SS type tester, a V-shaped guide and a plane glass are used in place of a glass tube, and a hammer is sucked up by a spring. In both of the C type and SS type testers, a bounding height is read instantaneously. In the D type tester, a hammer is fixed at the maximum bounding position by a ball clutch and the maximum position is indicated by a dial gauge so that the D type tester is more convenient than the C type and SS type testers, its handling is easier as compared with the other testers, impressions are unnoticeable and measurement can be carried out on an object to be measured because of its light weight, whereby the D type tester is used in the present invention.

As a method of providing the cushion layer and also providing a cover sheet on the support, particularly the above transparent support, there may be mentioned the following methods:

(1) a method in which a solution obtained by dissolving the above natural rubber or synthetic rubber in an organic solvent is coated on a support and dried by hot air or heating and then a cover sheet is superposed on the support and pressed under heating to effect lamination;

(2) the so-called hot melt lamination method in which an adhesive such as the above natural rubber or synthetic rubber is heated and coated on a support according to a doctor blade method, a roll coat method, a gravure method or a reverse roll method while the adhesive is kept in a melted state and a cover sheet is superposed on the support immediately after coating and heated at high temperature and then cooled, if necessary, to effect lamination;

(3) the so-called extrusion lamination method in which a synthetic rubber is extruded on a support by an extruder while the synthetic rubber is kept in a melted state and a cover sheet is pressed against the support while the synthetic rubber is in a melted state to effect lamination; and (4) the so-called co-extrusion method in which a layer comprising a synthetic rubber is formed on a support by one molding using plural extruders and the synthetic rubber in a melted state when a film to be used as a support is molded according to a melt extrusion method and a cover sheet is pressed against the support while the layer is in a melted state to effect lamination.

In all of the methods (1) to (4) described above, the cover sheet is superposed on the surface of the cushion layer after (or simultaneously with) providing the cushion layer on the support. The material of the cover sheet is not limited, and polyethylene terephthalate and the same materials as described above may be used. It is preferred that the cover sheet contains an antistatic agent or an antistatic layer is provided by coating on at least one surface of the cover sheet. The support having the cover sheet and the cushion layer obtained by either of the above methods (1) to (4) or other method is wound up once and then used for a subsequent step.

The color light-sensitive layer is provided on the cushion layer of the support by peeling the above cover sheet and then coating a coating solution for the color light-sensitive layer containing the light-sensitive composition and coloring agent described above.

In the present invention, as the developing solution to be used for developing the image-formable material, any developing solution may be used so long as it has an action of developing a material to be treated. It is preferred to use a developing solution containing an alikali agent and an anionic surfactant.

As the alkali agent which can be used, there may be mentioned:

(1) an inorganic alkali agent such as sodium silicate, potassium silicate, potassium hydroxide, sodium hydroxide, lithium hydroxide, sodium or ammonium secondary or tertiary phosphate, sodium metasilicate, sodium carbonate and ammonia; and (2) an organic amine compound such as mono-, di- or trimethylamine, mono-, di- or triethylamine, mono- or diisopropylamine, n-butylamine, mono-, di- or triethanolamine, mono-, di- or triisopropanolamine, ethyleneimine and ethylenediimine.

As the anionic surfactant which can be used, there may be mentioned:

(1) a higher alcohol sulfate such as a sodium salt of lauryl alcohol sulfate, an ammonium salt of octyl alcohol sulfate, an ammonium salt of lauryl alcohol sulfate and disodium alkylsulfate;

(2) an aliphatic alcohol phosphate such as a sodium salt of cetyl alcohol phosphate;

(3) an alkylarylsulfonate such as sodium dodecylbenzenesulfonate, sodium isopropylnaphthalenesulfonate, sodium dinaphthalenesulfonate and sodium metanitrobenzenesulfonate;

(4) an alkylamidesulfonate such as

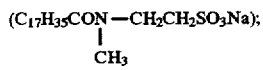

(5) a sulfonate of a dibasic aliphatic ester such as sodium sulfosuccinate dioctyl ester and sodium sulfosuccinate dihexyl ester; and (6) a formaldehyde condensate of an alkylnaphthalenesulfonate such as a formaldehyde condensate of sodium dibutylnaphthalenesulfonate.

The alkali agents and the anionic surfactants may be used in any desired combination.

EXAMPLES

The present invention is described in detail by referring to Examples and Comparative examples, but the present invention is not limited thereby.

Example 1

On a polyethylene terephthalate (PET) film having a thickness of 75 μm, a styrene-ethylene-butylene-styrene block copolymer resin Kraton G1650 (trade name, produced by Shell Chemical Co.) was coated to have a coating thickness of 40 μm according to the extrusion lamination method while coating the following anchoring agent, whereby a cushion layer was provided.

Anchoring agent: a toluene solution containing a urethane oligomer and an isocyanate compound (5% solution)

The cushion layer had a hardness of 75. The peeling strength of the cushion layer and PET was 300 gh/inch.

Subsequently, a side not subjected to antistatic treatment of a PET film which was wound around a roll and had a thickness of 25 μm and one surface on which an antistatic layer having the following recipe was provided by the following coating method was laminated on the above cushion layer by nip rollers. The resulting film was once wound around a roll.

(Antistatic coating solution)

Copolymer of sodium p-vinylbenzenesulfonate and 2-hydroxyethyl methacrylate (8:2, MW=20,000): 10 g Fluorine type surfactant Eftop EF-102 (trade name, produced by Mitsubishi Kinzoku Co.): 2 g Water: 1,000 g (Coating method)

Wire bar coating: coating using a bar around which a 0.10 mm wire was wound

Wet film thickness: 10 μm

Coating rate: 20 m/min

The film subjected to the lamination process had a surface resistance of $10^9$ Ω.

Subsequently, a light-sensitive solution having the following recipe was coated and dried under the following conditions while peeling the laminated PET film.

(Light-sensitive solution)

| | |
|---|---|
| o-Naphthoquinonediazide-4-sulfonic acid ester of p-cresol.formalin novolak resin (weight average molecular weight: 2,000) | 600 g |
| 50% Methanol solution of a vinyl acetate.vinyl versatate copolymer (charged weight ratio: 70:30, weight average molecular weight: 45,000) | 8,784 g |
| Pigments shown below | amounts shown below |
| Glutaric acid | 20 g |
| Fluorine type surfactant FC-430 (trade name, produced by 3M Co.) | 10 g |

<Pigments>

| | | |
|---|---|---|
| Yellow: | Seika Fast Yellow 2400 | 680 g |
| Magenta: | Seika Fast Carmine 1483 | 680 g |
| Cyan: | Cyanine Blue 4920 | 550 g |
| Black: | Carbon Black MA-100 | 990 g |

(Coating and drying conditions)

Coating conditions: a wire bar coater

Drying conditions: 80° C., 90 seconds

Coating rate: 10 m/min (Rate of peeling the laminated film was the same)

The transmission density of yellow was 0.50, that of magenta was 0.62, that of cyan was 0.61 and that of black was 0.64.

Subsequently, an overcoat solution having the following recipe was provided by coating on the upper surface of the light-sensitive layer by the same coater.

(Overcoat solution)

| | |
|---|---|
| Cellulose derivative (carboxymethyl cellulose) | 100 g |
| Water | 3,000 g |

On the PET film surface of the color image-formable material of four colors obtained as described above, color separation positive films of the respective colors were superposed. The color image-formable material was exposed from a distance of 50 cm for 30 seconds by using a 4 KW metal halide lamp, followed by developing treatment using the following developing solution at 30° C. for 45 seconds in a vat while rubbing with a sponge.

(Developing solution)

| | |
|---|---|
| Potassium silicate | 40 g |
| Pelex NBL (trade name, Kao Atlas Co.) | 80 g |
| Water | 2,000 g |

Next, an art paper Tokubishi art (trade name, produced by Mitsubishi Seishi Co.) was wound around a transferring machine, i.e., on a drum described in Japanese Provisional Patent Publication No. 120552/1991. Then, the image on the film prepared above was thermally transferred to the paper under the following temperature and pressurization conditions.

| Transfer conditions | Transfer condition 1 | Transfer condition 2 | Transfer condition 3 |
|---|---|---|---|
| Diameter of pressurizing roller | 12 cm | 12 cm | 12 cm |
| Diameter of drum | 30 cm | 30 cm | 30 cm |
| Nip pressure of pressurizing roller and drum | 5 kg/cm$^2$ | 5 kg/cm$^2$ | 7 kg/cm$^2$ |
| Surface temperature of drum | 75° C. | 75° C. | 75° C. |
| Surface temperature of pressurizing roller | 75° C. | 140° C. | 120° C. |
| Transfer rate | 45 seconds | 35 seconds | 30 seconds |

(Image-receiving material)

Art paper: Tokubishi art (trade name, produced by Mitsubishi Seishi Co.)

Matted paper: New Age (trade name, produced by Kanzaki Seishi Co.)

Wood free paper: wood free paper (produced by Oji Seishi Co.)

Transfer was effected in the order of yellow, magenta, cyan and black to obtain a high quality color image which could hardly be distinguished from a print.

Examples 2 to 10 and Comparative Examples 1 to 5

Procedures were carried out in the same manner as in Example 1 except for changing the hardness of the styrene-ethylene-butylene-styrene block copolymer used in Example 1 as shown in Table 1 by increasing or decreasing the amounts of styrene and butylene and changing the thickness of the cushion layer. The results are shown in Table 1.

Examples 11 to 13

Procedures were carried out in the same manner as in Example 1 except for changing the material for the cushion layer from the styrene-ethylene-butylene-styrene block copolymer (Kraton G1650) used in Example 1 to the compounds shown in Table 2. The results are shown in Table 1.

TABLE 2

| Example 11 | Styrene-butadiene-styrene block copolymer Cariflex TRKX-65 (trade name, produced by Shell Chemical Co.) |
|---|---|
| Example 12 | Styrene-isoprene-styrene block copolymer Cariflex TR1111 (trade name, produced by Shell Chemical Co.) |
| Example 13 | Polyurethane rubber (produced by Toyobo Co.) |

Example 14

Procedures were carried out in the same manner as in Example 1 except for using a PET film having cushion property on the surface of PET prepared as described below in place of the PET film having a thickness of 75 μm used in Example 1 and providing the light-sensitive layer by coating in the same manner as in Example 1 without providing a new cushion layer. The results are shown in Table 1.

A diazo type foaming agent (biurea compound) was incorporated into a PET film to prepare a film having a thickness of 25 μm. Next, foaming treatment of diazo was effected at high temperature (about 280° C.) to obtain a PET film having cushion property by foaming.

Comparative Example 6

Procedures were carried out in the same manner as in Example 1 except for using a PET film which was not subjected to antistatic treatment as a PET film to be laminated after providing the cushion layer by coating. As a result, sparks by static charge were caused in the step of peeling the cover sheet (the PET film) before coating the light-sensitive solution. Further, after exposure and development, the portion where sparks were caused of the image seemed to have no problem in appearance, but the portion was not transferred by thermal transfer.

The hardness was a Shore hardness and measured by the Shore hardness tester D type (a weight with a diamond was fallen from a predetermined height, a bounding height was measured and the height is used as a measure of hardness).

Evaluation of transfer property in Table 1 is as follows.

Transfer property:

⊙: no transfer failure portion of an image (A1 size)

O: no transfer failure portion of an image (1 or 2 transfer failure portion(s) which can be observed by a loupe (at a level which cannot be observed visually with naked eyes) in a dot portion) (A1 size)

Δ: transfer failure portions (at a level which can be observed visually with naked eyes) observed in a dot portion of an image X: transfer failure of a whole image

TABLE 1

| | Cushion layer | | | Image reproducibility on film (dot reproducibility) (%) | Transfer property of image | | | | | | | | | |
|---|---|---|---|---|---|---|---|---|---|---|---|---|---|---|
| | | | | | Transfer condition 1 Kind of paper | | | Transfer condition 2 Kind of paper | | | Transfer condition 3 Kind of paper | | | |
| | Hardness | Thickness (μm) | Peeling strength from the support gf/inch | | Art paper | Matted paper | Wood free paper | Art paper | Matted paper | Wood free paper | Art paper | Matted paper | Wood free paper | Remarks |
| Example 1 | 75 | 30 | 300 | 2 to 98 | ⊚ | ⊚ | ⊚ | ⊚ | ⊚ | ⊚ | ⊚ | ⊚ | ⊚ | |
| Example 2 | 75 | 20 | 300 | 2 to 98 | ⊚ | ⊚ | ⊚ | ⊚ | ⊚ | ⊚ | ⊚ | ⊚ | ⊚ | |
| Example 3 | 75 | 15 | 300 | 2 to 98 | ⊚ | ○ | ○ | ⊚ | ○ | ⊚ | ⊚ | ○ | ○ | |
| Example 4 | 75 | 50 | 300 | 2 to 98 | ⊚ | ⊚ | ⊚ | ⊚ | ⊚ | ⊚ | ⊚ | ⊚ | ⊚ | |
| Example 5 | 75 | 60 | 300 | 2 to 98 | ⊚ | ⊚ | ⊚ | ⊚ | ○ | ⊚ | ⊚ | ○ | ⊚ | |
| Example 6 | 75 | 95 | 300 | 2 to 98 | ⊚ | ⊚ | ⊚ | ⊚ | ○ | ⊚ | ⊚ | ○ | ⊚ | |
| Example 7 | 85 | 30 | 300 | 2 to 98 | ⊚ | ○ | ⊚ | ⊚ | ○ | ⊚ | ⊚ | ○ | ⊚ | |
| Example 8 | 83 | 30 | 300 | 2 to 98 | ⊚ | ○ | ⊚ | ⊚ | ⊚ | ⊚ | ⊚ | ○ | ⊚ | |
| Example 9 | 80 | 30 | 300 | 2 to 98 | ⊚ | ⊚ | ⊚ | ⊚ | ⊚ | ⊚ | ⊚ | ⊚ | ⊚ | |
| Example 10 | 48 | 30 | 300 | 2 to 98 | ⊚ | ⊚ | ⊚ | ⊚ | ⊚ | ⊚ | ⊚ | ⊚ | ⊚ | |
| Example 11 | 40 | 30 | 350 | 2 to 98 | ⊚ | ○ | ⊚ | ⊚ | ○ | ○ | ⊚ | ⊚ | ⊚ | |
| Example 12 | 46 | 30 | 300 | 2 to 98 | ⊚ | ○ | ⊚ | ⊚ | ⊚ | ⊚ | ⊚ | ⊚ | ⊚ | |
| Example 13 | 48 | 30 | 150 | 2 to 98 | ⊚ | ⊚ | ⊚ | ⊚ | ⊚ | ⊚ | ⊚ | ⊚ | ⊚ | |
| Example 14 | 70 | 35 | 200 | 2 to 98 | ⊚ | ○ | ⊚ | ○ | ○ | ○ | ○ | ○ | ○ | |
| Comparative example 1 | 75 | 13 | 300 | 2 to 98 | ○ | ○ | ○ | ○ | ○ | △ | ○ | ○ | △ | |
| Comparative example 2 | 75 | 110 | 300 | 5 to 93 | ⊚ | ⊚ | ⊚ | ⊚ | △* | △* | ⊚ | ○ | ⊚ | *Cushion layer was deformed (dot quality failure) |
| Comparative example 3 | 95 | 30 | 300 | 2 to 98 | ○ | △ | △ | ⊚ | × | ○ | ○ | △ | ○ | |
| Comparative example 4 | 37 | 30 | 300 | 4 to 96 | ⊚ | ○ | ○ | ⊚ | △* | △* | ⊚ | △* | ○ | *Dot quality failure |
| Comparative example 5 | 90 | 30 | 140 | 2 to 98 | ⊚ | ⊚ | ⊚ | △* | △* | △* | ○ | ○ | ○ | *Cushion layer was peeled off |
| Comparative example 6 | 75 | 30 | 300 | 2 to 98 | △* | △* | △* | △* | △* | △* | △* | △* | △* | *Spark unevenness by static charge was caused |

According to the present invention, it is possible to provide a color image-formable material which can give a color proof more approximate to a print even when an image-receiving material having poor paper quality and a rough surface is used and a process for preparing the same.

We claim:

1. A color image forming method comprising the steps of:
   imagewise exposing a color image-formable material which comprises a support provided thereon with a cushion layer, a color light-sensitive layer containing a light-sensitive composition and a coloring agent in this order,
   developing the exposed color image-formable material so as to remove a non-image portion and leave an image portion, and
   transferring the image portion of the light-sensitive layer alone to an image receiving material,
   wherein the cushion layer has a hardness measured by the Shore hardness tester of 40 to 85 and a thickness of 20 to 50 μm.

2. The method of claim 1 wherein the cushion layer has a hardness of 40 to 80.

3. The method of claim 1 wherein the peeling strength of the cushion layer and the support is 150 gf/inch or more.

4. The method of claim 1 wherein the cushion layer comprises a natural rubber or a synthetic rubber.

5. The method of claim 4 wherein the synthetic rubber is at least one selected from the group consisting of a thermoplastic rubber, an ethylene-ethyl acrylate copolymer resin, a polybutadiene rubber, a styrene-butadiene copolymer, an acrylonitrile-butadiene copolymer, a polyisoprene rubber resin, a styrene-isoprene copolymer, an acrylate copolymer and a polyurethane co-condensed rubber.

6. The method of claim 1, wherein the cushion layer has a hardness of 40 to 80 and a peeling strength between the cushion layer and the support of 150 gf/inch or more.

7. The method of claim 6, wherein the cushion layer comprises a natural rubber or a synthetic rubber.

* * * * *